(12) United States Patent
Kamishima et al.

(10) Patent No.: US 7,688,032 B2
(45) Date of Patent: Mar. 30, 2010

(54) BATTERY REMAINING CAPACITY DETECTING APPARATUS AND BATTERY REMAINING CAPACITY DETECTING METHOD

(75) Inventors: Utaka Kamishima, Kawasaki (JP); Shinsuke Nakazawa, Yokohama (JP)

(73) Assignee: Nissan Motor Co., Ltd., Yokohama (JP)

( * ) Notice: Subject to any disclaimer, the term of this patent is extended or adjusted under 35 U.S.C. 154(b) by 440 days.

(21) Appl. No.: 11/830,036

(22) Filed: Jul. 30, 2007

(65) Prior Publication Data

US 2008/0030169 A1 Feb. 7, 2008

(30) Foreign Application Priority Data

Aug. 3, 2006 (JP) .............................. 2006-212277

(51) Int. Cl.
  H01M 10/44 (2006.01)
  H01M 10/46 (2006.01)
(52) U.S. Cl. ....................................... 320/132; 324/433
(58) Field of Classification Search ................ 320/107, 320/132, 149; 324/426, 427, 430, 433; 340/635, 340/636.1, 636.12, 636.13, 636.15
  See application file for complete search history.

(56) References Cited

U.S. PATENT DOCUMENTS 6,107,779 A * 8/2000 Hara et al. ................... 320/132
6,586,940 B2 * 7/2003 Asakura et al. .............. 324/426
6,621,250 B1 * 9/2003 Ohkubo et al. .............. 324/426
7,323,848 B2 * 1/2008 Fujihara et al. .............. 320/132
2006/0055374 A1 * 3/2006 Fujihara et al. .............. 320/132

FOREIGN PATENT DOCUMENTS

JP 2002-170600 A 6/2002

* cited by examiner

Primary Examiner—Edward Tso
(74) Attorney, Agent, or Firm—Global IP Counselors, LLP

(57) ABSTRACT

A battery remaining capacity detecting apparatus includes a remaining capacity calculating section, first and second target remaining capacity calculating sections and a remaining capacity revising section. The first and second target remaining capacity calculating sections are configured to calculate first and second target remaining capacities using first and second calculation processes when first and second prescribed battery related conditions are satisfied, respectively. The second calculating process has a lower accuracy than the first calculation process, and the second prescribed battery related condition is satisfied with a higher frequency than the first prescribed battery related condition. The remaining capacity revising section is configured to revise the remaining capacity toward the first and second target remaining capacities using revision amounts equal to or smaller than first and second revision amount upper limit values, respectively with the second revision amount upper limit value being smaller than the first revision amount upper limit value.

17 Claims, 8 Drawing Sheets

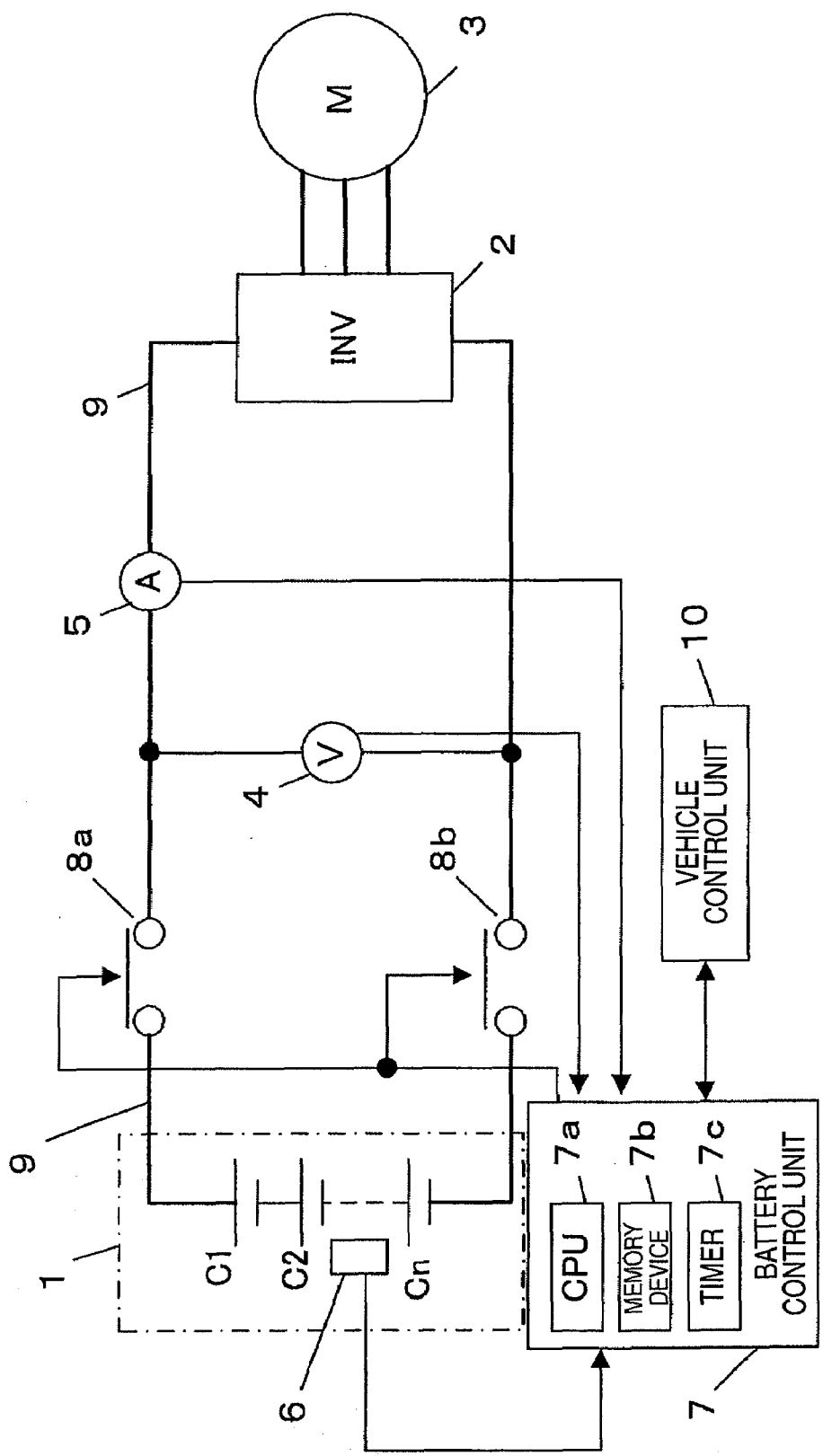
F I G. 1

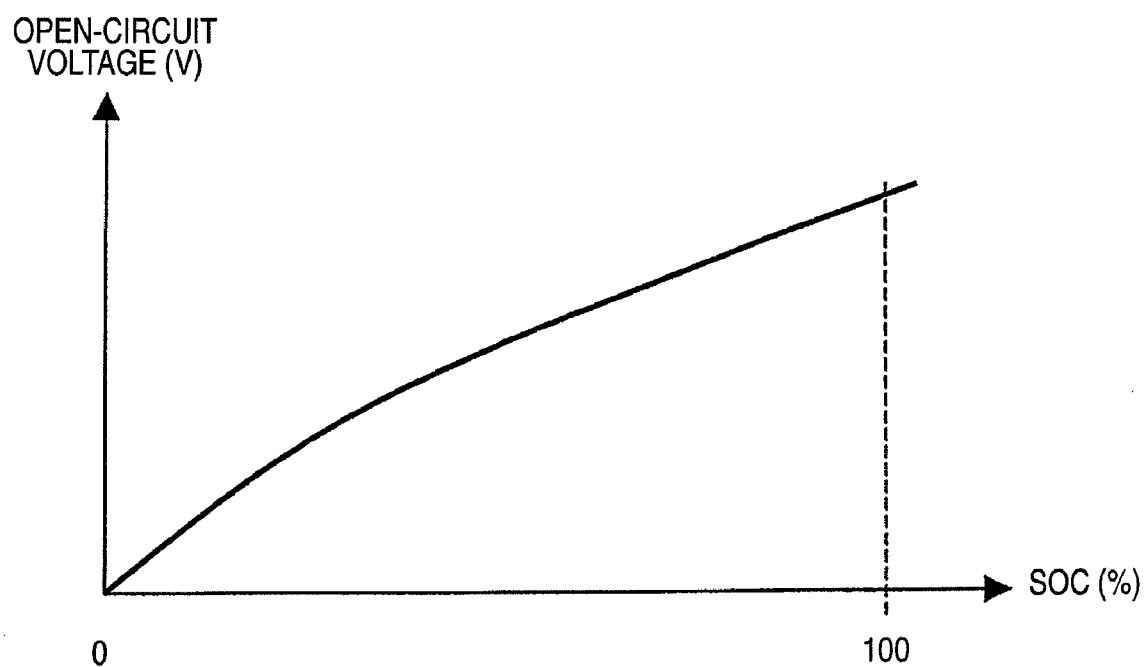
F I G. 2

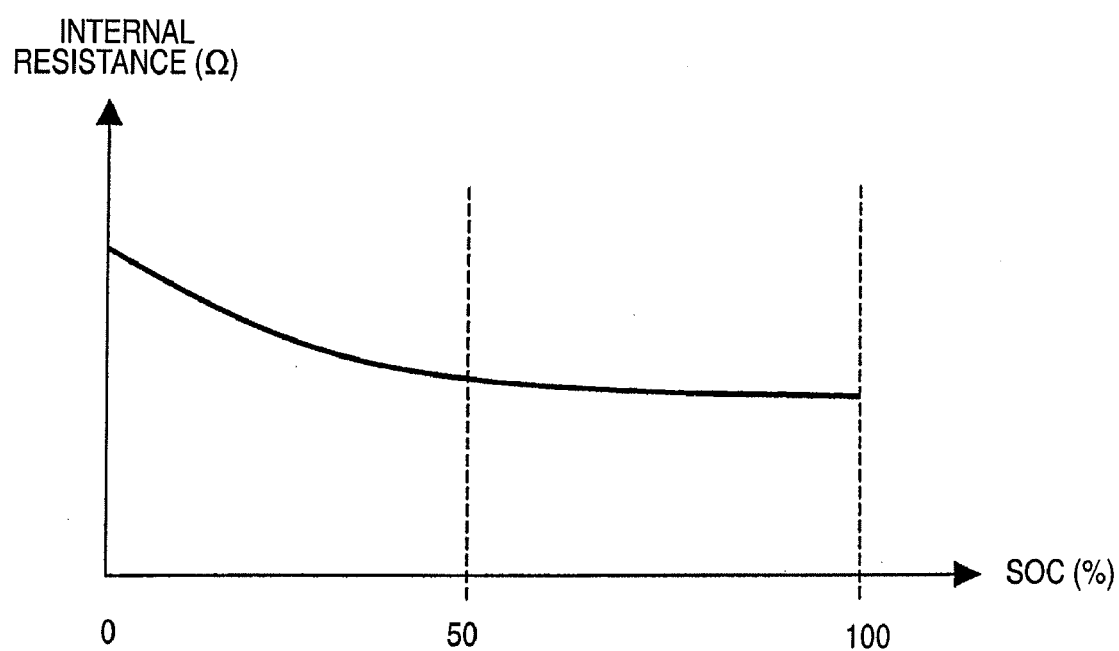
F I G. 3

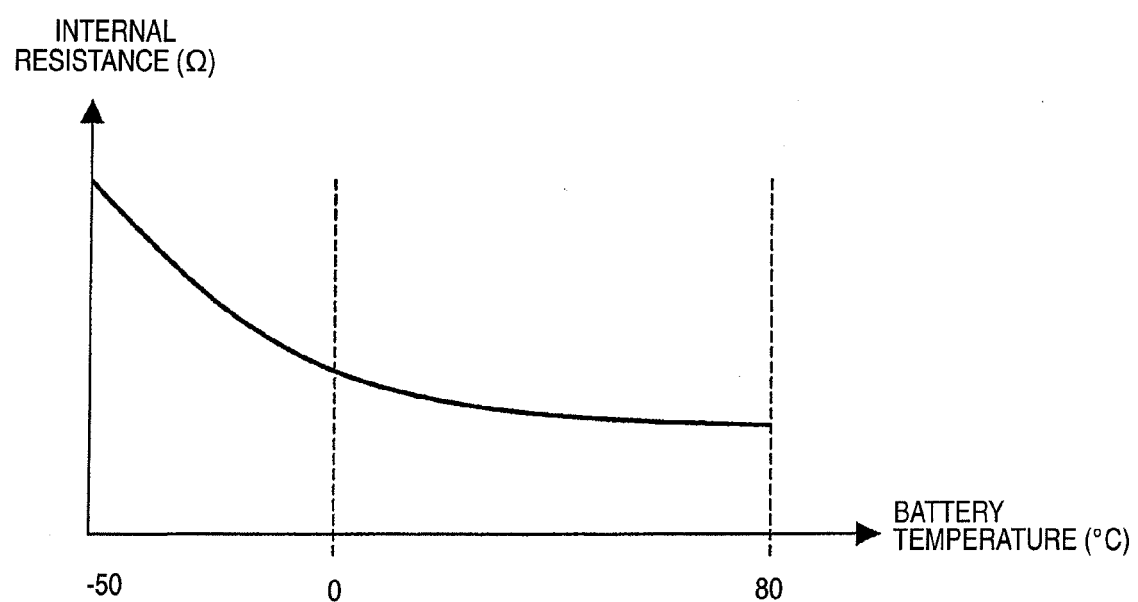
F I G. 4

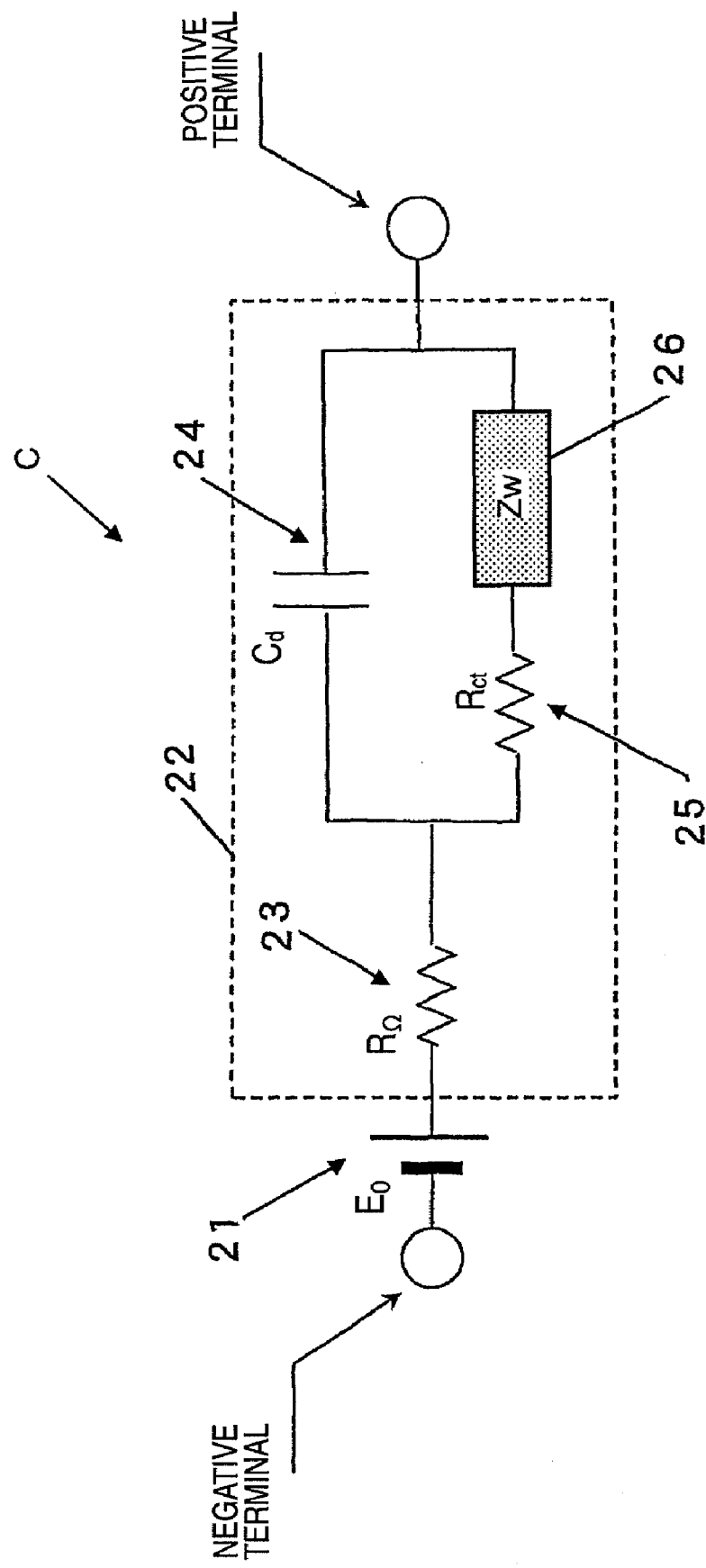
F I G. 5

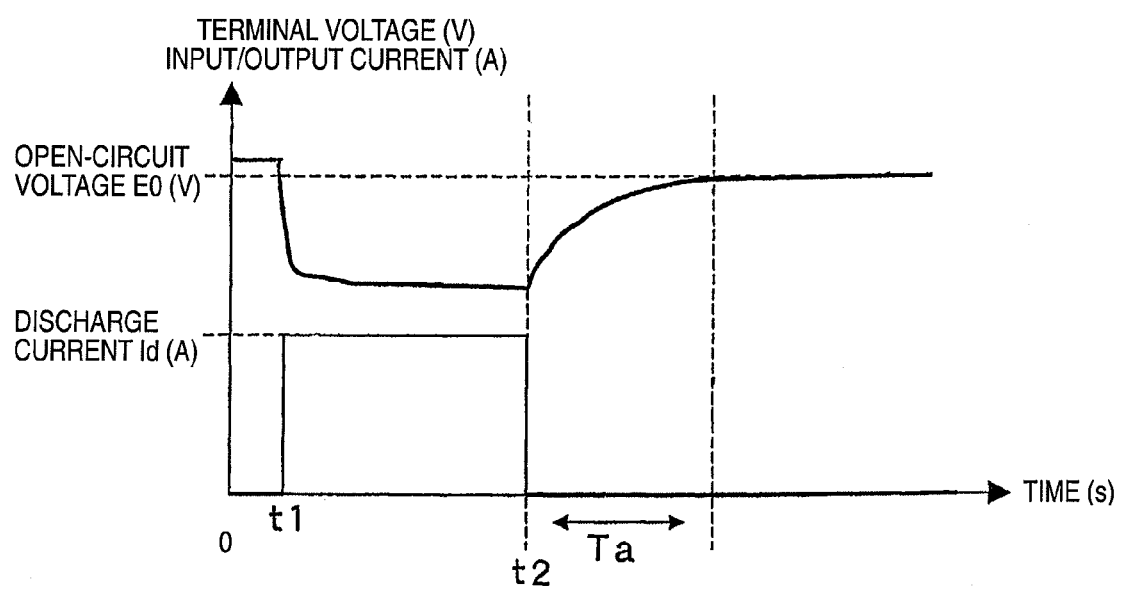
F I G. 6

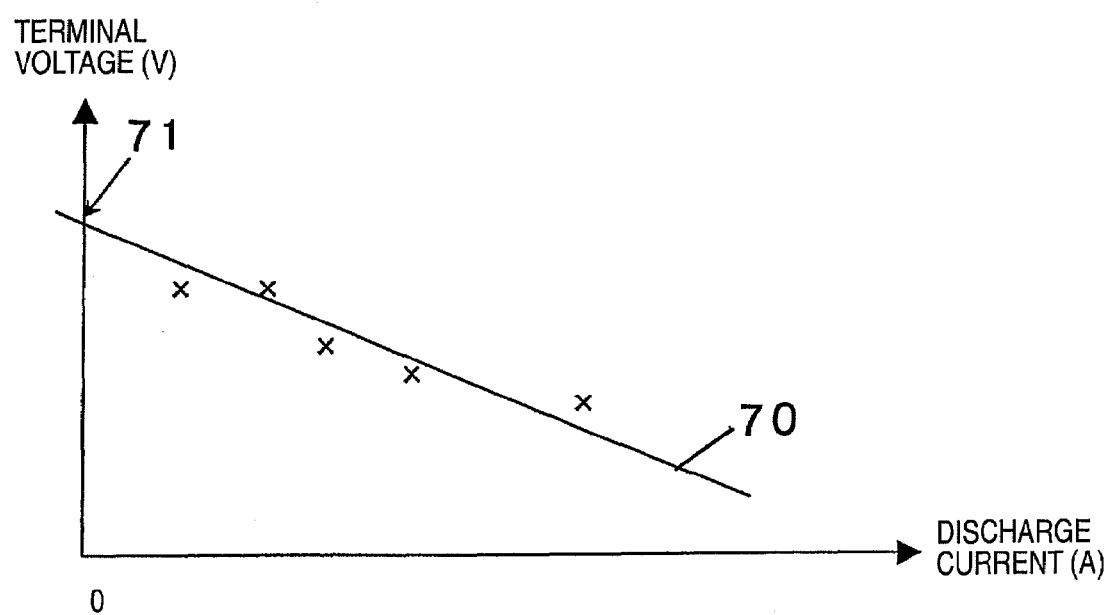
F I G. 7

BATTERY REMAINING CAPACITY DETECTING APPARATUS AND BATTERY REMAINING CAPACITY DETECTING METHOD

CROSS-REFERENCE TO RELATED APPLICATIONS

This application claims priority to Japanese Patent Application No. 2006-212277, filed on Aug. 3, 2006. The entire disclosure of Japanese Patent Application No. 2006-212277 is hereby incorporated herein by reference.

BACKGROUND OF THE INVENTION

1. Field of the Invention

The present invention relates to a battery remaining capacity detecting apparatus and a battery remaining capacity detecting method.

2. Background Information

Japanese Laid-Open Patent Publication No. 2002-170600 discloses a conventional battery remaining capacity detecting apparatus that detects a remaining capacity of a battery by integrating the charge/discharge current of the battery over time. When such conventional remaining capacity detecting apparatus integrates the charge/discharge current of the battery over a long period of time, the error of the detected current accumulates, and thus, there is the possibility that the error between the actual remaining capacity and the detected remaining capacity becomes large. Therefore, the conventional battery remaining capacity detecting apparatus as mentioned above performs a battery remaining capacity revision control by calculating the remaining capacity of the battery based on a voltage of the battery measured when the current of the battery is in a steady state (constant current state) and using the calculated remaining capacity value to revise the remaining capacity obtained by integrating the charge/discharge current of the battery.

In view of the above, it will be apparent to those skilled in the art from this disclosure that there exists a need for an improved battery remaining capacity detecting apparatus. This invention addresses this need in the art as well as other needs, which will become apparent to those skilled in the art from this disclosure.

SUMMARY OF THE INVENTION

With the battery remaining capacity revision control in the conventional battery remaining capacity detecting apparatus as described above, there are few opportunities for revising the remaining capacity obtained by integrating the charge/discharge current because the revision control is performed using the remaining capacity value calculated based on the battery voltage measured when the current of the battery is in a steady state. Consequently, there are times when an accurate remaining capacity of the battery cannot be obtained in the conventional battery remaining capacity detecting apparatus.

Accordingly, one object of the present invention is to provide battery remaining capacity detecting apparatus and method configured and arranged to obtain an accurate remaining capacity of the battery.

In order to achieve the above mentioned object, a battery remaining capacity detecting apparatus includes a remaining capacity calculating section, a first target remaining capacity calculating section, a second target remaining capacity calculating section and a remaining capacity revising section. The remaining capacity calculating section is configured to calculate a remaining capacity of a battery by an integration calculation process based on a value obtained by integrating one of a charge/discharge current and a charge/discharge power of the battery over time. The first target remaining capacity calculating section is configured to calculate a first target remaining capacity of the battery using a first calculation process that is different from the integration calculation process when a first prescribed battery related condition is satisfied. The second target remaining capacity calculating section is configured to calculate a second target remaining capacity of the battery using a second calculation process when a second prescribed battery related condition is satisfied. The second calculation process is different from the integration calculation process and the first calculation process with the second calculating process for calculating the second target remaining capacity having a lower accuracy than the first calculation process for calculating the first target remaining capacity. The second prescribed battery related condition being satisfied with a higher frequency than the first prescribed battery related condition. The remaining capacity revising section is configured to revise the remaining capacity calculated by the remaining capacity calculating section toward the first target remaining capacity using a revision amount equal to or smaller than a first revision amount upper limit value when the first prescribed battery related condition is satisfied, and to revise the remaining capacity calculated by the remaining capacity calculating section toward the second target remaining capacity using the revision amount equal to or smaller than a second revision amount upper limit value when the second prescribed battery related condition is satisfied, the second revision amount upper limit value being smaller than the first revision amount upper limit value.

These and other objects, features, aspects and advantages of the present invention will become apparent to those skilled in the art from the following detailed description, which, taken in conjunction with the annexed drawings, discloses a preferred embodiment of the present invention.

BRIEF DESCRIPTION OF THE DRAWINGS

Referring now to the attached drawings which form a part of this original disclosure:

FIG. 1 is an overall schematic view illustrating a drive system for an electric automobile having a battery remaining capacity detecting apparatus in accordance with one embodiment of the present invention;

FIG. 2 is a map showing an example of the relationship between the open-circuit voltage and the state of charge of a battery pack in accordance with the illustrated embodiment of the present invention;

FIG. 3 is a map showing an example of the relationship between the internal resistance and the state of charge of the battery pack in accordance with the illustrated embodiment of the present invention;

FIG. 4 is a map showing an example of the relationship between the internal resistance and the temperature of the battery pack in accordance with the illustrated embodiment of the present invention;

FIG. 5 is a schematic view of an equivalent circuit for an internal structure of a cell of the battery pack in accordance with the illustrated embodiment of the present invention;

FIG. 6 is a time chart showing how the terminal voltage of the battery pack changes over time after the battery pack has discharged under a prescribed load and the load has been removed in accordance with the illustrated embodiment of the present invention;

FIG. 7 is a map showing an example of a regression line calculated based on data points of detected voltage values and detected current values in accordance with the illustrated embodiment of the present invention.

DETAILED DESCRIPTION OF THE PREFERRED EMBODIMENTS

Figure 8:
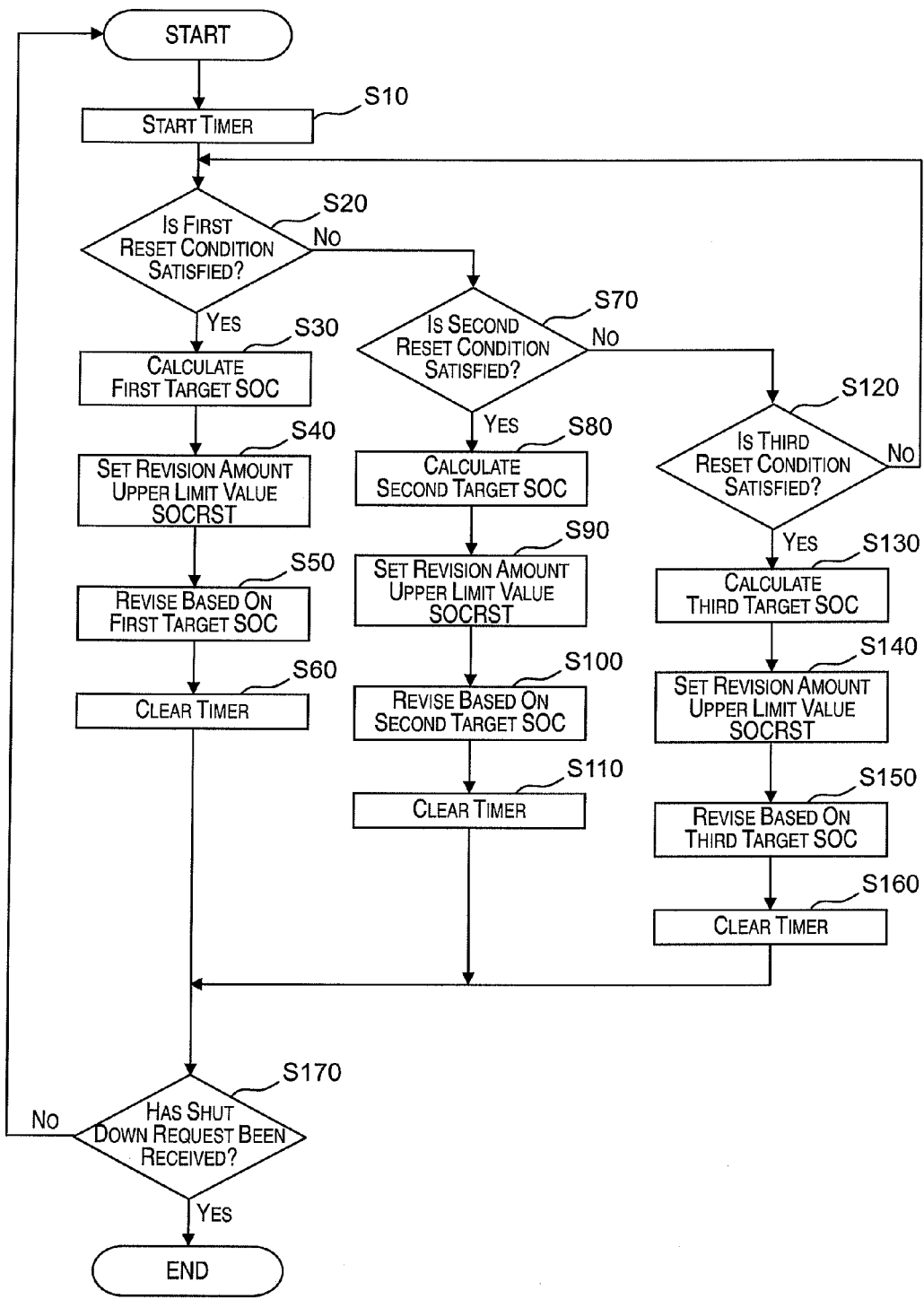
FIG. 8 is a flowchart showing a battery remaining capacity detecting control processing executed by the battery remaining capacity detecting apparatus in accordance with the illustrated embodiment of the present invention.

Selected embodiment of the present invention will now be explained with reference to the drawings. It will be apparent to those skilled in the art from this disclosure that the following description of the embodiment of the present invention are provided for illustration only and not for the purpose of limiting the invention as defined by the appended claims and their equivalents.

Referring initially to FIG. 1, a drive system of a vehicle (e.g., an electric vehicle) having a battery remaining capacity detecting apparatus in accordance with one embodiment of the present invention is illustrated. As shown in FIG. 1, the drive system includes a battery pack 1, an inverter 2 and a motor 3. Moreover, the drive system is further provided with a voltage sensor 4, a current sensor 5, a thermistor 6, a battery control unit 7, a pair of high voltage relays 8a and 8b, a high voltage harness 9 and a vehicle control unit 10.

The battery pack 1 includes a plurality of cells C1 to Cn connected in series. The battery pack 1 is arranged as, for example, a conventional lithium ion secondary battery that produces a direct current (DC) voltage. The DC voltage of the battery pack 1 is converted into a three-phase alternating current (AC) voltage by the inverter 2 and applied to the motor 3 that serves as a drive source for the electric automobile. The motor 3 is arranged as, for example, a conventional three-phase AC motor. The high voltage harness 9 is connected between the battery pack 1 and the inverter 2. The high voltage harness 9 is provided with the high voltage relays 8a and 8b as shown in FIG. 1. The ON/OFF status of each of the high voltage relays 8a and 8b is controlled by the battery control unit 7.

The voltage sensor 4 is configured and arranged to detect a total voltage BATVOL, i.e., an output voltage, of the battery pack 1. The current sensor 5 is configured and arranged to detect the charge current and the discharge current of the battery pack 1 (hereinafter referred to as "charge/discharge current BATCUR"). The charge/discharge current BATCUR has a negative value when the battery pack 1 is being charged and has a positive value when the battery pack 1 is discharging. The thermistor 6 is provided to detect the temperature of the battery pack 1.

The vehicle control unit 10 is connected to the battery control unit 7 with a vehicle internal LAN. The vehicle control unit 10 is configured to execute overall general control of the vehicle.

As shown in FIG. 1, the battery control unit 7 includes a CPU 7a, a memory device 7b, and a timer 7c. The battery control unit 7 is configured to receive signals indicative of the total battery voltage BATVOL detected by the voltage sensor 4, the battery charge/discharge current BATCUR detected by the current sensor 5, and the battery temperature detected by the thermistor 6 at a prescribed sampling rate. The battery control unit 7 preferably includes a microcomputer with a battery remaining capacity detecting control program that controls the calculation of the state of charge SOC of the battery pack 1 as discussed below. The battery control unit 7 can also include other conventional components such as an input interface circuit, an output interface circuit, and storage devices such as a ROM (Read Only Memory) device and a RAM (Random Access Memory) device. The memory circuit (e.g., the memory device 7b) stores processing results and control programs such as ones for the first, second and third target SOC calculation operations that are run by the processor circuit. The battery control unit 7 is operatively coupled to the battery pack 1, the high voltage relays 8a and 8b, and other various components in a conventional manner. The internal RAM of the battery control unit 7 stores statuses of operational flags and various control data. The internal ROM of the battery control unit 7 stores the various data for various operations. The battery control unit 7 is capable of selectively controlling any of the components of the control system in accordance with the control program. It will be apparent to those skilled in the art from this disclosure that the precise structure and algorithms for the battery control unit 7 can be any combination of hardware and software that will carry out the functions of the present invention. In other words, "means plus function" clauses as utilized in the specification and claims should include any structure or hardware and/or algorithm or software that can be utilized to carry out the function of the "means plus function" clause.

The memory device 7b is configured and arranged to store data indicating the relationship between the open-circuit voltage of the battery pack 1 (i.e., the voltage of the battery pack 1 when the battery pack 1 is neither charging nor discharging) and the state of charge (SOC) of the battery pack 1 (i.e., the ratio of the remaining capacity to the fully charged capacity), data indicating the relationship between the internal resistance and the state of charge (SOC) of the battery pack 1, and data indicating the relationship between the temperature of the battery pack 1 and a temperature compensation coefficient for revising the internal resistance of the battery pack 1. These data are obtained experimentally and stored in advance. The open-circuit voltage of the battery pack 1 is also called the no-load voltage because it corresponds to the voltage when the battery pack 1 is not carrying a load. The state of charge SOC is also called simply "remaining capacity" because the state of charge SOC is a numeric value that indicates the remaining capacity of the battery pack 1.

FIG. 2 is a map showing an example of the relationship between the open-circuit voltage and the state of charge SOC of the battery pack 1. FIG. 3 is a map showing an example of the relationship between the internal resistance and the state of charge SOC of the battery pack 1. FIG. 4 is a map showing an example of the relationship between the internal resistance and the temperature of the battery pack 1.

The battery control unit 7 is configured to continuously calculate the state of charge SOC of the battery pack 1 by integrating the charge/discharge current BATCUR detected when the battery pack 1 is charging or discharging (integration calculation process). Additionally, the battery control unit 7 is configured to revise (reset) the calculated state of charge SOC using a revision control process that will be described in more detail below.

First, the method of calculating the state of charge by integrating the charge/discharge current BATCUR will now be explained. The battery control unit 7 is configured to calculate a latest (updated) value AHCAP_new (ampere hours (Ah)) of the electric current integration capacity of the battery pack 1 (remaining capacity AHSOC calculated by integrating the charge/discharge current BATCUR) based on the previous value AHCAP_old (Ah) of the electric current integration capacity calculated in the previous control cycle and a current detection sampling rate RUNARATE (seconds (sec)) using the equation (1) shown below. As explained previously, the value of the charge/discharge current BATCUR (amperes (A)) is negative when a charge current is detected and is positive when a discharge current is detected.

$$AHCAP\_new = AHCAP\_old - (BATCUR \times RUNARATE)/3600 \quad (1)$$

The battery control unit 7 is configured to calculate an initial value of AHCAP_old based on the state of charge SOC (%) using the equation (1') below. The state of charge SOC is calculated based on the open-circuit voltage of the battery pack 1 in the no-load state (state obtained when the high voltage relays 8a and 8b are off) and the open-circuit voltage versus the state of charge SOC data stored in the memory device 7b (which is data expressing the relationship between the open-circuit voltage and the state of charge SOC as seen in, for example, FIG. 2).

$$\text{Initial value of } AHCAP\_old = AHFULL \times SOC/100 \quad (1')$$

In the equation (1') above, a value AHFULL indicates the capacity (Ah) of the battery pack 1 when the battery pack 1 is fully charged.

Using the equation (2) shown below, the battery control unit 7 is configured to calculate the state of charge SOC of the battery pack 1 based on the electric current integration capacity AHCAP_new calculated with the above equation (1). The state of charge SOC calculated by integrating the charge/discharge electric current BATCUR is indicated as AHSOC (%).

$$AHSOC\ (\%) = AHCAP\_new/AHFULL \times 100 \quad (2)$$

Battery Remaining Capacity Revision Control Process

The methods of calculating target values of the state of charge (i.e., the target SOC) for revising the state of charge AHSOC calculated based on the value obtained by integrating the charge/discharge current BATCUR will now be explained. In this illustrated embodiment, the remaining capacity detecting apparatus of the present invention is configured to calculate a first target SOC, a second target SOC, and a third target SOC for revising the state of charge AHSOC calculated by integrating the charge/discharge current BATCUR.

First Target SOC Computation Process

The battery control unit 7 is configured to calculate the first target SOC (first target remaining capacity) with a first computation process when a first reset condition is satisfied. The first reset condition is arranged such that the first target SOC is calculated with the lowest frequency among the three target SOCs (i.e., the first reset condition for calculating the first target SOC is satisfied less often than second and third reset conditions for calculating the second and third target SOCs, respectively). The first computation process is configured such that the calculation accuracy of the first target SOC is the highest among the three target SOCs.

More specifically, the battery control unit 7 is configured to calculate the first target SOC based on the open-circuit voltage of the battery pack 1. The battery control unit 7 is configured to use the terminal voltage (voltage between terminals) of the battery pack 1 when a prescribed amount of time Ta has elapsed since an absolute value of the charge/discharge current BATCUR became smaller than a prescribed current I1 (first prescribed current value) as the open-circuit voltage. The battery control unit 7 is configured to calculate the first target SOC based on this open-circuit voltage and the open-circuit voltage versus the state of charge SOC data stored in the memory device 7b (which is data expressing the relationship between the open-circuit voltage and the state of charge SOC such as one shown in FIG. 2). The prescribed current I1 is a value small enough to assume that the battery pack 1 is neither charging nor discharging (i.e., in the no-load state).

The battery control unit 7 is configured to use the terminal voltage of the battery pack 1 as the open-circuit voltage when a prescribed amount of time Ta has elapsed since the absolute value of the charge/discharge current BATCUR became smaller than the prescribed current I1 for the following reasons.

FIG. 5 is a schematic view of an equivalent circuit for the internal structure of one cell C of the cells C1 to Cn of the battery pack 1. As shown in FIG. 5, the cell C includes an electricity generating element 21 and an internal resistance element 22. The electricity generating element 21 generates electricity due to a chemical reaction. The internal resistance element 22 includes a solution resistance 23, a double layer capacitance 24, a charge transfer resistance 25, and a Warburg impedance 26.

FIG. 6 is a time chart illustrating how the terminal voltage (voltage between the terminals) of the battery pack 1 changes over time after discharging at a prescribed current Id is stopped (the charge/discharge current value is set to 0). At time t1 in FIG. 6, discharging from the battery pack 1 at the discharge current Id is started and the terminal voltage of the battery pack 1 declines. At time t2, the discharging from the battery pack 1 is stopped and the terminal voltage rises. Due to the internal resistance element 22 of the battery pack 1, a prescribed amount of time Ta must elapse before the terminal voltage returns to a value close to the open-circuit voltage E0. Therefore, the terminal voltage of the battery pack 1 when the prescribed amount of time Ta has elapsed since the absolute value of the charge/discharge current BATCUR became smaller than the prescribed current I1 is used as the open-circuit voltage of the battery pack 1. The prescribed amount of time Ta is preferably determined experimentally and is set in advance.

Thus, in order to perform the first computation process for calculating the first target SOC, the first reset condition must be satisfied in which the prescribed amount of time Ta has elapsed since the absolute value of the charge/discharge current BATCUR became smaller than the prescribed current I1.

Second Target SOC Computation Process

The battery control unit 7 is configured to calculate the second target SOC (first or second target remaining capacity) by a second computation process when a second reset condition is satisfied. The second reset condition is arranged such that the second target SOC is calculated with the second highest frequency among the three target SOCs (i.e., the second reset condition for calculating the second target SOC is satisfied less often than a third reset condition for calculating the third target SOC but more often than the first reset condition for calculating the first target SOC). The second computation process is configured such that the calculation accuracy of the second target SOC is the second highest among the three target SOCs (i.e., the calculation accuracy of the second computation process for calculating the second target SOC is higher than that of the third computation process for calculating the third target SOC, but lower than that of the first computation process for calculating the first target SOC).

The second computation process for calculating the second target SOC will now be explained. First, the battery control unit 7 is configured to calculate the internal resistance REST of the battery pack 1 based on the state of charge calculated based on the current integration value and the internal resistance versus the state of charge SOC data stored in the memory device 7b (which is data expressing the relationship between the internal resistance and the state of charge SOC such as the one shown in FIG. 3). Since the internal resistance changes in accordance with the temperature of the battery pack 1, the calculated internal resistance is revised using the temperature compensation coefficient. The temperature compensation coefficient is obtained based on the temperature of the battery pack 1 detected by the thermistor 6 and the battery temperature versus the revision coefficient data stored in the memory device 7b (which is data expressing the relationship between the battery temperature and the revision coefficient (temperature compensation coefficient) for revising the internal resistance).

When a prescribed amount of time (e.g., 5 seconds) has elapsed since the battery pack 1 started discharging and the discharge current has become equal to or smaller than a prescribed current I2 (second prescribed current value), the battery control unit 7 is configured to calculate the open-circuit voltage EZERO (volts (V)) of the battery pack 1 using the equation (3) below based on the voltage BATVOL (V) detected by the voltage sensor 4, the discharge current BATCUR detected by the current sensor 5, and the internal resistance REST calculated by the method described above. Generally, if the discharge current is too large, then the internal resistance rises sharply and the error between the open-circuit voltage EZERO calculated with the equation (3) and the actual open-circuit voltage increases. Therefore, the prescribed current I2 is set so as to establish a range (upper limit value) of current values for which the open-circuit voltage EZERO can be calculated accurately with the equation (3) and the open-circuit voltage EZERO is only calculated using the equation (3) when the discharge current is equal to or below the prescribed current I2.

$$EZERO = BATVOL + BATCUR \times REST \quad (3)$$

Finally, the battery control unit 7 is configured to calculate the state of charge SOC, i.e., the second target SOC, based on the open-circuit voltage EZERO calculated using the equation (3) and the open-circuit voltage versus the state of charge SOC data stored in the memory device 7b such as one shown in FIG. 2.

Thus, in order to perform the second computation process for calculating the second target SOC, the second reset condition must be satisfied in which a prescribed amount of time (e.g., 5 seconds) has elapsed since the battery pack 1 started discharging and that the discharge current is equal to or below the prescribed current I2. Since the only requirement regarding the prescribed current I2 is that it be small enough to avoid an abrupt increase in the internal resistance, the value of the prescribed current I2 is larger than the value of the prescribed current I1 used to define the first reset condition (which determines when the first target SOC can be calculated). Therefore, the frequency with which the second reset condition is satisfied is higher than the frequency with which the first reset condition is satisfied.

The prescribed amount of time used in the second reset condition is set so as to coordinate the condition for detecting the current with a third reset condition (described later) and can be changed as necessary.

Third Target SOC Computation Process

The battery control unit 7 is configured to calculate the third target SOC (second or third target remaining capacity) by a third computation process when a third reset condition is satisfied. The third reset condition is arranged such that the third target SOC is calculated with the highest frequency among the three target SOCs (i.e., the third reset condition for calculating the third target SOC is satisfied more often than the first and second reset conditions). The third computation process is configured such that the calculation accuracy of the third target SOC is the lowest among the three target SOCs.

The third computation process for calculating the third target SOC will now be explained. First, while the battery pack 1 is charging or discharging, more specifically when a prescribed amount of time (e.g., 5 seconds (similarly to the second reset condition)) has elapsed since the battery pack 1 started discharging, the battery control unit 7 is configured to collect a plurality of data points comprising the voltage BATVOL detected by the voltage sensor 4 and the discharge current BATCUR detected by the current sensor 5. The collected data points of the voltage BATVOL and the discharge current BATCUR data are plotted on a graph configured such that the voltage is indicated on the vertical axis and the current is indicated on the horizontal axis. Then, the battery control unit 7 is configured to calculate a straight regression line (generally called an I-V line or I-V curve) based on the plotted points. FIG. 7 is a map showing an example of the regression line 70 calculated based on data points of the detected voltage values and the detected current values. The voltage corresponding to a point 71 in FIG. 7 where the regression line 70 intersects the voltage vertical axis where the discharge current is 0 is taken as the open-circuit voltage of the battery pack 1. Then, the battery control unit 7 is configured to calculate the state of charge, i.e., the third target SOC, based on the open-circuit voltage of the battery pack 1 calculated using the regression line (e.g., the regression line 70 shown in FIG. 7) and the open-circuit voltage versus the state of charge SOC data stored in the memory device 7b such as one shown in FIG. 2.

Thus, in order to perform the third computation process for calculating the third target SOC, the third reset condition must be satisfied in which a number of data points (i.e., total voltage BATVOL versus discharge current BATCUR data points) required for calculating a regression line have been collected. The third reset condition is satisfied when a predetermined number of data points, i.e., the number of data points required for calculating the regression line, have been collected, and thus, the third reset condition is not dependent on the value of the discharge current of the battery pack 1. For example, the third reset condition can be determined based on a prescribed time being elapsed since the last revision by the third computation process with the prescribed time being set so that the predetermined number of data points can be collected within the prescribed time. Alternatively, the third reset condition can be determined based on the battery condition indicative of that the predetermined number of data points has been collected. Consequently, the third reset condition is satisfied with a higher frequency than the first and second reset conditions described above.

Battery Remaining Capacity Detecting Control

FIG. 8 is a flowchart showing a control processing executed by the battery control unit 7 (the CPU 7a) of the battery remaining capacity detecting apparatus in accordance with the illustrated embodiment of the present invention. When a key switch (ignition switch) (not shown) is operated by a driver of the vehicle, the vehicle starts and electric power is supplied to the battery control unit 7. The CPU 7a of the battery control unit 7 is then configured to start executing step S10 of FIG. 8.

In step S10, the CPU 7a is configured to start the timer 7c, and then proceed to step S20.

In step S20, the CPU 7a is configured to determine if the first reset condition is satisfied. If the first reset condition is satisfied (Yes in step S20), then the CPU 7a proceeds to step S30.

In step S30, the CPU 7a is configured to calculate the first target SOC using the first computation process described previously. The calculated first target SOC is indicated as ECAPSOC1. After calculating the first target SOC (ECAPSOC1), the CPU 7a proceeds to step S40.

In step S40, the CPU 7a is configured to calculate a revision amount upper limit value that serves as an upper limit to the amount by which the remaining capacity AHSOC calculated by integrating the charge/discharge current BATCUR of the battery pack 1 is revised based on the first target SOC (ECAPSOC1). More specifically, the CPU 7a is first configured to calculate a maximum value SOCRSTMAX of the electric current integration error accumulated since the previous reset control (previous revision control) using the equation (4) below based on the time TIMRST (seconds) measured by the timer 7c.

$$SOCRSTMAX = MAXDSOC \times TIMRST \quad (4)$$

In the equation (4) above, a value MAXDSOC represents a maximum value of the electric current integration error per unit time that has been converted into a value having the same unit as the state of charge SOC value. The maximum value MAXDSOC of the electric current integration error per unit time is preferably set in advance based on the error between the detected current value acquired by the battery control unit 7 and the actual current value (i.e., the detection error of the current sensor 5). This error is preferably determined in advance experimentally or by some other appropriate methods.

The CPU 7a is then configured to compare the maximum value SOCRSTMAX of the electric current integration error calculated with the equation (4) above to a first revision amount upper limit value SOCRST1 that has been set in advance, and to set the smaller of the two values as a revision amount upper limit value SOCRST. In other words, if the condition SOCRSTMAX≦SOCRST1 exists, then the revision amount upper limit value SOCRST is set to the value of the maximum value SOCRSTMAX of the electric current integration error (SOCRST=SOCRSTMAX). On the other hand, if the condition SOCRST1<SOCRSTMAX exists, then the revision amount upper limit value SOCRST is set to the value of the first revision amount upper limit value SOCRST1 (SOCRST=SOCRST1). The first revision amount upper limit value SOCRST1 is preferably a preset value that has been determined in advance experimentally or by another appropriate method. For example, the first revision amount upper limit value SOCRST1 can be set to a maximum value of the error between the first target SOC and the actual state of charge SOC obtained experimentally or the like.

After step S40, the CPU 7a proceeds to step S50. In step S50, the CPU 7a is configured to reset (revise) the remaining capacity AHSOC calculated by integrating the charge/discharge current BATCUR of the battery pack 1 based on the first target SOC (ECAPSOC1) calculated in step S30. More specifically, in step S50, the CPU 7a is configured to reset the remaining capacity AHSOC differently depending on whether or not the absolute value of the difference between the first target SOC (ECAPSOC1) and the remaining capacity AHSOC is equal to or smaller than the revision amount upper limit value SOCRST set in step S40.

If the condition |ECAPSOC1−AHSOC|≦SOCRST exists in step S50, then the value of the remaining capacity AHSOC is changed to the value ECAPSOC1, i.e., the value of the first target SOC.

On the other hand, if the condition |ECAPSOC1−AHSOC|>SOCRST and the condition ECAPSOC1>AHSOC exist, then the remaining capacity AHSOC is revised in accordance with the equation (5) shown below.

$$AHSOC(\text{latest value}) = AHSOC(\text{previous value}) + SOCRST \quad (5)$$

On the other hand, if the condition |ECAPSOC1−AHSOC|>SOCRST and the condition ECAPSOC1<AHSOC exist, then the remaining capacity AHSOC is revised in accordance with the equation (6) shown below.

$$AHSOC(\text{latest value}) = AHSOC(\text{previous value}) - SOCRST \quad (6)$$

In short, the remaining capacity AHSOC calculated by integrating the charge/discharge current BATCUR of the battery pack 1 is revised toward the first target SOC (ECAPSOC1) and the revision amount used to accomplish the revision is limited so as to be equal to or smaller than the revision amount upper limit value SOCRST.

After step S50, the CPU 7a proceeds to step S60. In step S60, the CPU 7a is configured to clear (sets to 0) the time measurement value of the timer 7c. Then, the CPU 7a proceeds to step S170.

On the other hand, if in step S20 the CPU 7a determines that the first reset condition is not satisfied (No in step S20), then the CPU 7a proceeds to step S70.

In step S70, the CPU 7a is configured to determine if the second reset condition is satisfied. If the second reset condition is satisfied (Yes in step S70), then the CPU 7a proceeds to step S80.

In step S80, the CPU 7a is configured to calculate the second target SOC using the second computation process described previously. The calculated second target SOC is indicated as ECAPSOC2. After calculating the second target SOC (ECAPSOC2), the CPU 7a proceeds to step S90.

In step S90, the CPU 7a is configured to calculate a revision amount upper limit value that serves as an upper limit to the amount by which the remaining capacity AHSOC calculated by integrating the charge/discharge current BATCUR of the battery pack 1 is revised based on the second target SOC (ECAPSOC2). Similarly to step S40, the CPU 7a is configured to calculate a maximum value SOCRSTMAX of the electric current integration error using the aforementioned equation (4) based on the time TIMRST (seconds) measured by the timer 7c. Then, the CPU 7a is configured to compare the maximum value SOCRSTMAX to a second revision amount upper limit value SOCRST2. The CPU 7a is then configured to set the smaller of the two values as the revision amount upper limit value SOCRST. The second revision amount upper limit value SOCRST2 is preferably set in advance to a prescribed value that is smaller than the first revision amount upper limit value SOCRST1.

After step S90, the CPU 7a proceeds to step S100. In step S100, the CPU 7a is configured to reset (revise) the remaining capacity AHSOC calculated by integrating the charge/discharge current BATCUR of the battery pack 1 based on the second target SOC (ECAPSOC2) calculated in step S80. The method of revising the remaining capacity AHSOC is the basically same as the method used in step S50.

More specifically, in step S100, the CPU 7a is configured to reset the remaining capacity AHSOC differently depending on whether or not the absolute value of the difference between the second target SOC (ECAPSOC2) and the remaining capacity AHSOC is equal to or smaller than the revision amount upper limit value SOCRST set in step S90.

If the condition |ECAPSOC2−AHSOC|≦SOCRST exists, then the CPU 7a is configured to change the value of the remaining capacity AHSOC to the value ECAPSOC2, i.e., the value of the second target SOC.

On the other hand, if the condition |ECAPSOC2−AHSOC|>SOCRST and the condition ECAPSOC2>AHSOC exist, then, similarly to step S50, the CPU 7a is configured to revise the remaining capacity AHSOC in accordance with the equation (5) shown below.

$$AHSOC(\text{latest value}) = AHSOC(\text{previous value}) + SOCRST \quad (5)$$

On the other hand, if the condition |ECAPSOC2−AHSOC|>SOCRST and the condition ECAPSOC2<AHSOC exist, then, similarly to step S50, the CPU 7a is configured to revise the remaining capacity AHSOC in accordance with the equation (6) shown below.

$$AHSOC(\text{latest value}) = AHSOC(\text{previous value}) - SOCRST \quad (6)$$

In short, the remaining capacity AHSOC calculated by integrating the charge/discharge current BATCUR of the battery pack 1 is revised toward the second target SOC (ECAPSOC2) and the revision amount used to accomplish the revision is limited so as to be equal to or smaller than the revision amount upper limit value SOCRST.

After step S100, the CPU 7a proceeds to step S110. In step S110, the CPU 7a is configured to clear (set to 0) the time measurement value of the timer 7c. Then, the CPU 7a proceeds to step S170.

On the other hand, if in step S70 the CPU 7a determines that the second reset condition is not satisfied (No in step S70), the CPU 7a proceeds to step S120.

In step S120, the CPU 7a is configured to determine if the third reset condition is satisfied. If the CPU 7a determines that the third reset condition is not satisfied (No in step S120), the CPU 7a returns to step S20. If the CPU 7a determines that the third reset condition is satisfied (Yes in step S120), then the CPU 7a proceeds to step S130.

In step S130, the CPU 7a is configured to calculate the third target SOC using the third computation process described previously. The calculated third target SOC is indicated as ECAPSOC3. After calculating the third target SOC (ECAPSOC3), the CPU 7a proceeds to step S140.

In step S140, the CPU 7a is configured to calculate a revision amount upper limit value that serves as an upper limit to the amount by which the remaining capacity AHSOC calculated by integrating the charge/discharge current BATCUR of the battery pack 1 is revised based on the third target SOC (ECAPSOC3). Similarly to steps S40 and S90, the CPU 7a is configured to calculate a maximum value SOCRSTMAX of the electric current integration error using the aforementioned equation (3) based on the time TIMRST (seconds) measured by the timer 7c. Then, the CPU 7a is configured to compare the maximum value SOCRSTMAX to a third revision amount upper limit value SOCRST3. The CPU 7a is then configured to set the smaller of the two values as the revision amount upper limit value SOCRST. The third revision amount upper limit value SOCRST3 is preferably set in advance to a prescribed value that is smaller than the second revision amount upper limit value SOCRST2. In other words, the relationship expressed in the equation (7) below exists among the first revision amount upper limit value SOCRST1, the second revision amount upper limit value SOCRST2, and the third revision amount upper limit value SOCRST3.

$$SOCRST3 < SOCRST2 < SOCRST1 \quad (7)$$

After step S140, the CPU 7a proceeds to step S150. In step S150, the CPU 7a is configured to reset (revise) the remaining capacity AHSOC calculated by integrating the charge/discharge current BATCUR of the battery pack 1 based on the third target SOC (ECAPSOC3) calculated in step S130. The method of revising the remaining capacity AHSOC is the basically same as the method used in steps S50 and S100.

More specifically, in step S150, the CPU 7a is configured to reset the remaining capacity AHSOC differently depending on whether or not the absolute value of the difference between the third target SOC (ECAPSOC3) and the remaining capacity AHSOC is equal to or smaller than the revision amount upper limit value SOCRST set in step S140.

If the condition |ECAPSOC3−AHSOC|≦SOCRST exists, then the CPU 7a is configured to change the value of the remaining capacity AHSOC to the value ECAPSOC3, i.e., the value of the third target SOC.

On the other hand, if the condition |ECAPSOC3−AHSOC|>SOCRST and the condition ECAPSOC3>AHSOC exist, then, similarly to steps S50 and S100, the CPU 7a is configured to revise the remaining capacity AHSOC in accordance with the equation (5) shown below.

$$AHSOC(\text{latest value}) = AHSOC(\text{previous value}) + SOCRST \quad (5)$$

On the other hand, if the condition |ECAPSOC3−AHSOC|>SOCRST and the condition ECAPSOC3<AHSOC exist, then, similarly to steps S50 and S100, the CPU 7a is configured to revise the remaining capacity AHSOC in accordance with the equation (6) shown below.

$$AHSOC(\text{latest value}) = AHSOC(\text{previous value}) - SOCRST \quad (6)$$

In short, the remaining capacity AHSOC calculated by integrating the charge/discharge current BATCUR of the battery pack 1 is revised toward the third target SOC (ECAPSOC3) and the revision amount used to accomplish the revision is limited so as to be equal to or smaller than the revision amount upper limit value SOCRST.

After step S150, the CPU 7a proceeds to step S160. In step S160, the CPU 7a is configured to clear (set to 0) the time measurement value of the timer 7c. Then, the CPU 7a proceeds to step S170.

In step S170, the CPU 7a is configured to determine if a shut down request has been received. When the driver turns off the key switch (ignition switch) (not shown), the battery control unit 7 receives the shut down request. If the CPU 7a determines that the shut down request has not been received (No in step S170), then the CPU 7a returns to step S10 and repeats the remaining capacity detecting control as shown in the flowchart of FIG. 8. On the other hand, if the CPU 7a determines that the shut down request has been received (Yes in step S170), the CPU 7a ends this processing sequence for calculating the remaining capacity (state of charge SOC) of the battery pack 1.

Accordingly, the battery remaining capacity detecting apparatus in accordance with the illustrated embodiment is configured to calculate the remaining capacity AHSOC by integrating the charge/discharge current BATCUR of the battery pack 1. The battery remaining capacity detecting apparatus is further configured to calculate a first target remaining capacity (the first target SOC or the second target SOC) for revising the remaining capacity AHSOC calculated by integrating the charge/discharge current BATCUR of the battery pack 1 when the first prescribed battery related condition (the first reset condition or the second reset condition) is satisfied, and to calculate a second target remaining capacity (the second target SOC or the third target SOC) for revising the remaining capacity AHSOC calculated by integrating the charge/discharge current BATCUR of the battery pack 1 when the second prescribed battery related condition (the second reset condition or the third reset condition) is satisfied, the second prescribed battery related condition occurring (being satisfied) at a higher frequency than the first prescribed battery related condition. The second calculation process (the second computation process or the third computation process) of the second target remaining capacity is arranged to be less accurate than the first calculation process (the first computation process or the second computation process) of the first target remaining capacity. If the first prescribed battery related condition is satisfied, then the remaining capacity AHSOC calculated by integrating the charge/discharge current BATCUR of the battery pack 1 is revised toward the first target remaining capacity (the first target remaining capacity serving as a target value) with a revision amount that is equal to or smaller than a first revision amount upper limit value (SOCRST1 or SOCRST2). Meanwhile, if the second prescribed battery related condition is satisfied, then the remaining capacity AHSOC calculated by integrating the charge/ discharge current BATCUR is revised toward the second target remaining capacity (the second target remaining capacity serving as a target value) with a revision amount that is equal to or smaller than a second revision amount upper limit value (SOCRST2 or SOCRST3) that is smaller than the first revision amount upper limit value. As a result, a balance can be achieved between the frequency and the accuracy with which the remaining capacity AHSOC is revised. More specifically, although the number of revisions (revision frequency) would be small if only revisions based on the first target remaining capacity were executed, the number of revisions is increased by using the second target remaining capacity as well. Additionally, although the revisions based on the second target remaining capacity are less accurate comparing to revisions based on the first target remaining capacity, those revisions do not cause abrupt changes in the remaining capacity (i.e., do not cause large differences between the latest remaining capacity and the previous remaining capacity) because they are limited by a smaller revision amount upper limit value than the revisions based on the first target remaining capacity (i.e., the second revision amount upper limit value is smaller than the first revision amount upper limit value). Thus, the revision accuracy can be prevented from declining excessively when the remaining capacity is revised based on the second target remaining capacity (which is less accurate than revisions based on the first target remaining capacity).

Moreover, the battery remaining capacity detecting apparatus in accordance with this illustrated embodiment is configured such that the first revision amount upper limit value and the second revision amount upper limit value are both equal to or smaller than the maximum error SOCRSTMAX that occurs when the remaining capacity AHSOC is calculated by integrating the charge/discharge current BATCUR of the battery pack 1. As a result, the remaining capacity AHSOC is prevented from being revised by a larger amount than is necessary. More specifically, the amount of time TIMRST elapsed since integration of the charge/discharge current started is measured and the maximum error SOCRSTMAX accumulated while calculating the remaining capacity AHSOC by integrating the charge/discharge current BATCUR is determined based on the measured amount of time and a maximum error MAXDSOC per unit time of the integration value obtained by integrating the charge/discharge current BATCUR of the battery pack 1.

Furthermore, the battery remaining capacity detecting apparatus in accordance with the illustrated embodiment is configured such that, when the third prescribed battery related condition (third reset condition) is satisfied, the third target remaining capacity (third target SOC) is calculated for revising the remaining capacity AHSOC calculated by integrating the charge/discharge current BATCUR of the battery pack 1 and the remaining capacity AHSOC calculated by integrating the charge/discharge current BATCUR is revised toward the third target remaining capacity using a revision amount that is equal to or smaller than a third revision amount upper limit value (SOCRST3). The third prescribed battery related condition is arranged so that the third prescribed battery related condition occurs more frequently than the second prescribed battery related condition. The third calculation process (the third computation process) for calculating the third target remaining capacity is arranged to be less accurate than the second calculation process (the second computation process) for calculating the second target remaining capacity. As a result, still more balance can be achieved between the frequency and the accuracy with which the remaining capacity AHSOC is revised. More specifically, by executing revisions based on the third target remaining capacity, the number of revisions can be increased even further while abrupt changes in the remaining capacity is prevented because the revision amount is limited by a third revision amount upper limit value (SOCRST3) that is smaller than the second revision amount upper limit value.

The present invention is not limited to the particular constituent features of the illustrated embodiment. Fore example, although in the illustrated embodiment, the state of charge SOC (AHSOC) is calculated continuously by integrating the charge/discharge current BATCUR of the battery pack 1, it is also acceptable to calculate the state of charge SOC (AHSOC) by integrating the charge/discharge power of the battery pack 1.

Although, in the illustrated embodiment, three target SOC values (i.e., the first target SOC, the second target SOC and the third target SOC) are calculated for revising the state of charge AHSOC calculated based on a value obtained by integrating the charge/discharge current BATCUR of the battery pack 1, it is also acceptable to calculate, for example, only two target SOC values (e.g., the first target SOC and the second target SOC, the first target SOC and the third target SOC, or the second target SOC and the third target SOC). Furthermore, the methods of calculating the target SOC values used for revising the state of charge AHSOC calculated by integrating the charge/discharge current BATCUR of the battery pack 1 are not limited to those described in the illustrated embodiment. In other words, other conventional methods or processes for calculating the state of charge (remaining capacity) of the battery pack 1 can be utilized as the first, second or third calculation process of the present invention.

In the illustrated embodiment, in order to calculate the second target SOC, the open-circuit voltage EZERO of the battery pack 1 is calculated based on the voltage BATVOL detected by the voltage sensor 4, the discharge current BATCUR detected by the current sensor 5, and the internal resistance REST when the prescribed amount of time has elapsed since the battery pack 1 started discharging and the discharge current has become equal to or smaller than the prescribed current I2. It is also possible to calculate the open-circuit voltage EZERO using the same method when the battery pack 1 is being charged.

Although, in the illustrated embodiment, the revision amount upper limit values are set with respect to all of the target SOC values (the first to third target SOCs), it is acceptable not to set a revision amount limit value when the state of charge AHSOC calculated by integrating the charge/discharge current BATCUR is revised based on the first target SOC, which is calculated with the highest degree of accuracy. In other words, the upper limit of the revision amount used for revising based on the first target SOC can be avoided, for example, by setting the first revision amount limit value SOCRST1 to a large value, such as infinity ($\infty$).

Although the illustrated embodiment presents an example in which the battery remaining capacity detecting apparatus is employed in an electric vehicle, the battery remaining capacity detecting apparatus can also be employed in a hybrid vehicle, a fuel cell vehicle, or in other systems (other than a vehicle) that uses a battery.

The battery control unit 7 preferably constitutes the remaining capacity calculating section, the first target remaining capacity calculating section, the second target remaining capacity calculating section, the third target remaining capacity calculating section, the remaining capacity revising section, and the maximum error calculating section mentioned in the claims. The timer 7c preferably constitutes the time measuring section mentioned in the claims.

Accordingly, the battery remaining capacity detecting apparatus in accordance with the illustrated embodiment of the present invention is configured to revise the remaining capacity of the battery based on both the first target remaining capacity and the second target remaining capacity that is calculated more frequently than the first target remaining capacity. Consequently, the remaining capacity of the battery can be revised a relatively greater number of times. Additionally, although the second target remaining capacity is calculated less accurately than the first target remaining capacity, it does not degrade the accuracy of the revision process because the revisions based on the second target remaining capacity are limited by a second revision amount upper limit value that is smaller than the first revision amount upper limit value used for revisions based on the first target remaining capacity. As a result, the detected remaining capacity can be revised at a higher frequency and with a smaller amount of revision error, thereby enabling the remaining capacity of a secondary battery to be detected accurately.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. The term "detect" as used herein to describe an operation or function carried out by a component, a section, a device or the like includes a component, a section, a device or the like that does not require physical detection, but rather includes determining, measuring, modeling, predicting or computing or the like to carry out the operation or function. The term "configured" as used herein to describe a component, section or part of a device includes hardware and/or software that is constructed and/or programmed to carry out the desired function. Moreover, terms that are expressed as "means-plus function" in the claims should include any structure that can be utilized to carry out the function of that part of the present invention. The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A battery remaining capacity detecting apparatus comprising:
    a remaining capacity calculating section configured to calculate a remaining capacity of a battery by an integration calculation process based on a value obtained by integrating one of a charge/discharge current and a charge/discharge power of the battery over time;
    a first target remaining capacity calculating section configured to calculate a first target remaining capacity of the battery using a first calculation process that is different from the integration calculation process when a first prescribed battery related condition is satisfied;
    a second target remaining capacity calculating section configured to calculate a second target remaining capacity of the battery using a second calculation process when a second prescribed battery related condition is satisfied, the second calculation process being different from the integration calculation process and the first calculation process with the second calculating process for calculating the second target remaining capacity having a lower accuracy than the first calculation process for calculating the first target remaining capacity, the second prescribed battery related condition being satisfied with a higher frequency than the first prescribed battery related condition; and a remaining capacity revising section configured to revise the remaining capacity calculated by the remaining capacity calculating section toward the first target remaining capacity using a revision amount equal to or smaller than a first revision amount upper limit value when the first prescribed battery related condition is satisfied, and to revise the remaining capacity calculated by the remaining capacity calculating section toward the second target remaining capacity using the revision amount equal to or smaller than a second revision amount upper limit value when the second prescribed battery related condition is satisfied, the second revision amount upper limit value being smaller than the first revision amount upper limit value.

2. The battery remaining capacity detecting apparatus as recited in claim 1, wherein the remaining capacity revising section includes a maximum error calculating section configured to calculate a maximum value of a calculation error of the remaining capacity calculated by the remaining capacity calculating section, the remaining capacity revising section being further configured to limit the revision amount to a value equal to or smaller than the maximum calculation error value calculated by the maximum error calculating section.

3. The battery remaining capacity detecting apparatus as recited in claim 2, further comprising a time measuring section configured to measure an amount of time elapsed since a previous revision of the remaining capacity by the remaining capacity revising section, the maximum error calculating section being configured to calculate the maximum value of the calculation error of the remaining capacity calculated by the remaining capacity calculating section based on the amount of time measured by the time measuring section and a maximum error per unit time of the remaining capacity obtained by the integration calculation process.

4. The battery remaining capacity detecting apparatus as recited in claim 1, wherein the first target remaining capacity calculating section is configured to calculate the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, and the second target remaining capacity calculating section is configured to calculate an internal resistance of the battery, to calculate an open-circuit voltage of the battery based on the internal resistance, the terminal voltage and the charge/discharge current of the battery, and to calculate the second target remaining capacity based on the open-circuit voltage when the second prescribed battery related condition is satisfied in which the absolute value of the charge/discharge current of the battery is smaller than a second prescribed current value that is larger than the first prescribed current value.

5. The battery remaining capacity detecting apparatus as recited in claim 4, wherein the first target remaining capacity calculating section is configured to calculate the first target remaining capacity based on the terminal voltage of the battery when a prescribed amount of time has elapsed since the first prescribed battery related condition was satisfied.

6. The battery remaining capacity detecting apparatus as recited in claim 1, wherein the first target remaining capacity calculating section is configured to calculate the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, and the second target remaining capacity calculating section is configured to calculate an I-V line indicating a current of the battery relative to a voltage of the battery based on a plurality of charge/discharge current values and a plurality of terminal voltage values detected, to calculate an open-circuit voltage of the battery based on the I-V line, and to calculate the second target remaining capacity based on the open-circuit voltage when the second prescribed battery related condition is satisfied in which the charge/discharge current value of the battery and the terminal voltage of the battery have been detected for a predetermined number of times over time.

7. The battery remaining capacity detecting apparatus as recited in claim 1, wherein the first target remaining capacity calculating section is configured to calculate an internal resistance of the battery, to calculate a first open-circuit voltage of the battery based on the internal resistance, the terminal voltage and the charge/discharge current of the battery, and to calculate the first target remaining capacity based on the first open-circuit voltage when the first prescribed battery related condition is satisfied in which an absolute value of the charge/discharge current of the battery is smaller than a prescribed current value, and the second target remaining capacity calculating section is configured to calculate an I-V line indicating a current of the battery relative to a voltage of the battery based on a plurality of charge/discharge current values and a plurality of terminal voltage values detected, to calculate a second open-circuit voltage of the battery based on the I-V line, and to calculate the second target remaining capacity based on the second open-circuit voltage when the second prescribed battery related condition is satisfied in which the charge/discharge current value of the battery and the terminal voltage of the battery have been detected for a predetermined number of times over time.

8. The battery remaining capacity detecting apparatus as recited in claim 1, further comprising a third target remaining capacity calculating section configured to calculate a third target remaining capacity of the battery using a third calculation process when a third prescribed battery related condition is satisfied, the third calculation process being different from the integration calculation process, the first calculation process and the second calculation process with the third calculation process for calculating the third target remaining capacity having a lower accuracy than the second calculation process for calculating the second target remaining capacity, the third prescribed battery related condition being satisfied with a higher frequency than the second prescribed battery related condition, the remaining capacity revising section being further configured to revise the remaining capacity calculated by the remaining capacity calculating section toward the third target remaining capacity using the revision amount equal to or smaller than a third revision amount upper limit value that is smaller than the second revision amount upper limit value when the third prescribed battery related condition is satisfied.

9. The battery remaining capacity detecting apparatus as recited in claim 8, wherein the first target remaining capacity calculating section is configured to calculate the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, the second target remaining capacity calculating section is configured to calculate an internal resistance of the battery, to calculate a second open-circuit voltage of the battery based on the internal resistance, the terminal voltage and the charge/discharge current of the battery, and to calculate the second target remaining capacity based on the second open-circuit voltage when the second prescribed battery related condition is satisfied in which the absolute value of the charge/discharge current of the battery is smaller than a second prescribed current value that is larger than the first prescribed current value, and the third target remaining capacity calculating section is configured to calculate an I-V line indicating a current of the battery relative to a voltage of the battery based on a plurality of charge/discharge current values and a plurality of terminal voltage values detected, to calculate a third open-circuit voltage of the battery based on the I-V line, and to calculate the third target remaining capacity based on the third open-circuit voltage when the third prescribed battery related condition is satisfied in which the charge/discharge current value of the battery and the terminal voltage of the battery have been detected for a predetermined number of times over time.

10. A battery remaining capacity detecting method comprising:

calculating a remaining capacity of a battery by an integration calculation process based on a value obtained by integrating one of a charge/discharge current and a charge/discharge power of the battery over time;

calculating a first target remaining capacity of the battery using a first calculation process that is different from the integration calculation process when a first prescribed battery related condition is satisfied;

calculating a second target remaining capacity of the battery using a second calculation process when a second prescribed battery related condition is satisfied, the second calculation process being different from the integration calculation process and the first calculation process with the second calculating process for calculating the second target remaining capacity having a lower accuracy than the first calculation process for calculating the first target remaining capacity, the second prescribed battery related condition being satisfied with a higher frequency than the first prescribed battery related condition;

revising the remaining capacity calculated by the integration calculation process toward the first target remaining capacity using a revision amount equal to or smaller than a first revision amount upper limit value when the first prescribed battery related condition is satisfied; and revising the remaining capacity calculated by the integration calculation process toward the second target remaining capacity using the revision amount equal to or smaller than a second revision amount upper limit value when the second prescribed battery related condition is satisfied, the second revision amount upper limit value being smaller than the first revision amount upper limit value.

11. The battery remaining capacity detecting method as recited in claim 10, wherein the calculating of the first target remaining capacity includes calculating the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, and the calculating of the second target remaining capacity includes calculating an internal resistance, calculating an open-circuit voltage of the battery based on the internal resistance, the terminal voltage and the charge/discharge current of the battery, and calculating the second target remaining capacity based on the open-circuit voltage when the second prescribed battery related condition is satisfied in which the absolute value of the charge/discharge current of the battery is smaller than a second prescribed current value that is larger than the first prescribed current value.

12. The battery remaining capacity detecting method as recited in claim 11, wherein the calculating of the first target remaining capacity includes calculating the first target remaining capacity based on the terminal voltage of the battery when a prescribed amount of time has elapsed since the first prescribed battery related condition was satisfied.

13. The battery remaining capacity detecting method as recited in claim 10, wherein the calculating of the first target remaining capacity includes calculating the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, and the calculating of the second target remaining capacity includes calculating an I-V line indicating a current of the battery relative to a voltage based on a plurality of charge/discharge current values of the battery and a plurality of terminal voltages of the battery detected, calculating an open-circuit voltage of the battery based on the I-V line, and calculating the second target remaining capacity based on the open-circuit voltage when the second prescribed battery related condition is satisfied in which the charge/discharge current value of the battery and the terminal voltage of the battery have been detected for a predetermined number of times over time.

14. The battery remaining capacity detecting method as recited in claim 10, wherein the calculating of the first target remaining capacity includes calculating an internal resistance, calculating a first open-circuit voltage of the battery based on the internal resistance, the terminal voltage and the charge/discharge current of the battery, and calculating the first target remaining capacity based on the first open-circuit voltage when the first prescribed battery related condition is satisfied in which an absolute value of the charge/discharge current of the battery is smaller than a prescribed current value, and the calculating of the second target remaining capacity includes calculating an I-V line indicating a current of the battery relative to a voltage based on a plurality of charge/discharge current values of the battery and a plurality of terminal voltages of the battery detected, calculating a second open-circuit voltage of the battery based on the I-V line, and calculating the second target remaining capacity based on the second open-circuit voltage when the second prescribed battery related condition is satisfied in which the charge/discharge current value of the battery and the terminal voltage of the battery have been detected for a predetermined number of times over time.

15. The battery remaining capacity detecting method as recited in claim 10, further comprising calculating a third target remaining capacity of the battery using a third calculation process when a third prescribed battery related condition is satisfied, the third calculation process being different from the integration calculation process, the first calculation process and the second calculation process with the third calculation process for calculating the third target remaining capacity having a lower accuracy than the second calculation process for calculating the second target remaining capacity, the third prescribed battery related condition being satisfied with a higher frequency than the second prescribed battery related condition, and revising the remaining capacity calculated by the integration calculation process toward the third target remaining capacity using the revision amount equal to or smaller than a third revision amount upper limit value that is smaller than the second revision amount upper limit value when the third prescribed battery related condition is satisfied.

16. The battery remaining capacity detecting method as recited in claim 15, wherein the calculating of the first target remaining capacity includes calculating the first target remaining capacity based on a terminal voltage of the battery when the first prescribed battery related condition is satisfied in which an absolute value of the charge/discharge current of the battery is smaller than a first prescribed current value that substantially corresponds to a no-load state of the battery, the calculating of the second target remaining capacity includes calculating an internal resistance, calculating a second open-circuit voltage of the battery based on the internal resistance, the terminal voltage and the charge/discharge current of the battery, and calculating the second target remaining capacity based on the second open-circuit voltage when the second prescribed battery related condition is satisfied in which the absolute value of the charge/discharge current of the battery is smaller than a second prescribed current value that is larger than the first prescribed current value, and the calculating of the third target remaining capacity includes calculating an I-V line indicating a current of the battery relative to a voltage based on a plurality of charge/discharge current values of the battery and a plurality of terminal voltages of the battery detected, calculating a third open-circuit voltage of the battery based on the I-V line, and calculating the third target remaining capacity based on the third open-circuit voltage when the third prescribed battery related condition is satisfied in which the charge/discharge current value of the battery and the terminal voltage of the battery have been detected for a predetermined number of times over time.

17. A battery remaining capacity detecting apparatus comprising:

remaining capacity calculating means for calculating a remaining capacity of a battery by an integration calculation process based on a value obtained by integrating one of a charge/discharge current and a charge/discharge power of the battery over time;

first target remaining capacity calculating means for calculating a first target remaining capacity of the battery using a first calculation process that is different from the integration calculation process when a first prescribed battery related condition is satisfied;

second target remaining capacity calculating means for calculating a second target remaining capacity of the battery using a second calculation process when a second prescribed battery related condition is satisfied, the second calculation process being different from the integration calculation process and the first calculation process with the second calculating process for calculating the second target remaining capacity having a lower accuracy than the first calculation process for calculating the first target remaining capacity, the second prescribed battery related condition being satisfied with a higher frequency than the first prescribed battery related condition;

first target remaining capacity revising means for revising the remaining capacity calculated by the integration calculation process toward the first target remaining capacity using a revision amount equal to or smaller than a first revision amount upper limit value when the first prescribed battery related condition is satisfied; and second target remaining capacity revising means for revising the remaining capacity calculated by the integration calculation process toward the second target remaining capacity using the revision amount equal to or smaller than a second revision amount upper limit value when the second prescribed battery related condition is satisfied, the second revision amount upper limit value being smaller than the first revision amount upper limit value.

* * * * *